United States Patent
Ko (10) Patent No.: US 7,539,070 B2
(45) Date of Patent: May 26, 2009

(54) SEMICONDUCTOR MEMORY APPARATUS AND METHOD OF RESETTING INPUT/OUTPUT LINES OF THE SAME

(75) Inventor: Bok-Rim Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 415 days.

(21) Appl. No.: 11/541,573

(22) Filed: Oct. 3, 2006

(65) Prior Publication Data
US 2007/0080712 A1    Apr. 12, 2007

(30) Foreign Application Priority Data
Oct. 6, 2005    (KR)    ............... 10-2005-0093857

(51) Int. Cl.
*G11C 7/00*    (2006.01)
(52) U.S. Cl. ............... 365/191; 365/63; 365/190; 365/202; 365/230.06
(58) Field of Classification Search ............... 365/191, 365/63, 190, 230.06, 202
See application file for complete search history.

(56) References Cited

U.S. PATENT DOCUMENTS 5,659,514 A * 8/1997 Hazani ............... 365/218
5,719,812 A   2/1998 Seki et al.
6,026,034 A   2/2000 Suzuki et al.
6,728,122 B2 * 4/2004 Tanizaki et al. ............... 365/3
2004/0022091 A1 2/2004 Takita et al.

FOREIGN PATENT DOCUMENTS

JP    10-312684    11/1998
JP    2001-126473    5/2001

* cited by examiner

*Primary Examiner*—Pho M. Luu
(74) *Attorney, Agent, or Firm*—Venable LLP; Jeffri A. Kaminski (57) ABSTRACT

A semiconductor memory apparatus includes a plurality of unit cell blocks formed in row and column directions, at least a pair of first input and output lines formed at predetermined intervals in the row direction, at least a pair of second input and output lines formed at predetermined intervals in the column direction, I/O switches connected to a first node group and a second node group and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks and a reset selection unit that selectively outputs a reset signal to each line of the I/O switches.

14 Claims, 7 Drawing Sheets

SEMICONDUCTOR MEMORY APPARATUS AND METHOD OF RESETTING INPUT/OUTPUT LINES OF THE SAME

BACKGROUND

1. Technical Field

The present invention relates to a semiconductor memory apparatus. In particular, the present invention relates to a semiconductor memory apparatus and to a method of resetting the input/output lines of a semiconductor memory apparatus.

2. Related Art

A semiconductor memory apparatus according to the related art will be described with reference to the accompanying drawings.

Figure 1:
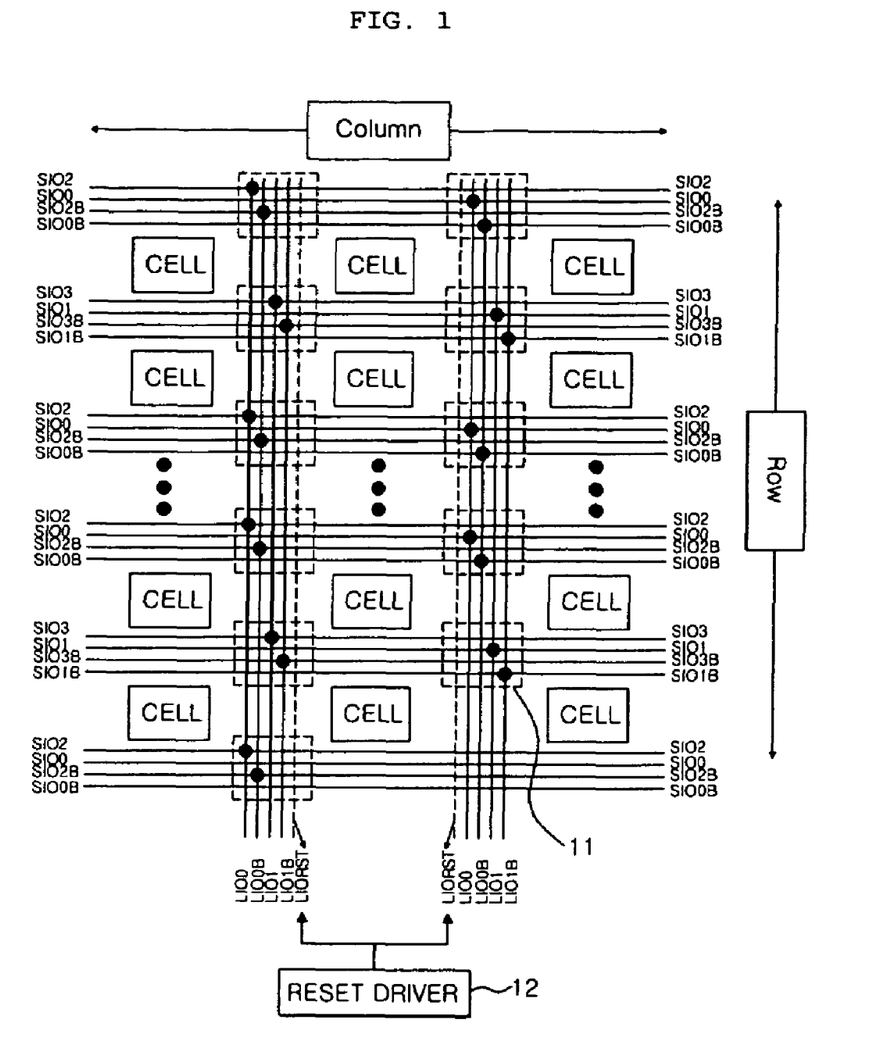
FIG. 1 is a schematic diagram showing the layout of a core cell structure of a semiconductor memory apparatus according to the related art.
Figure 2:
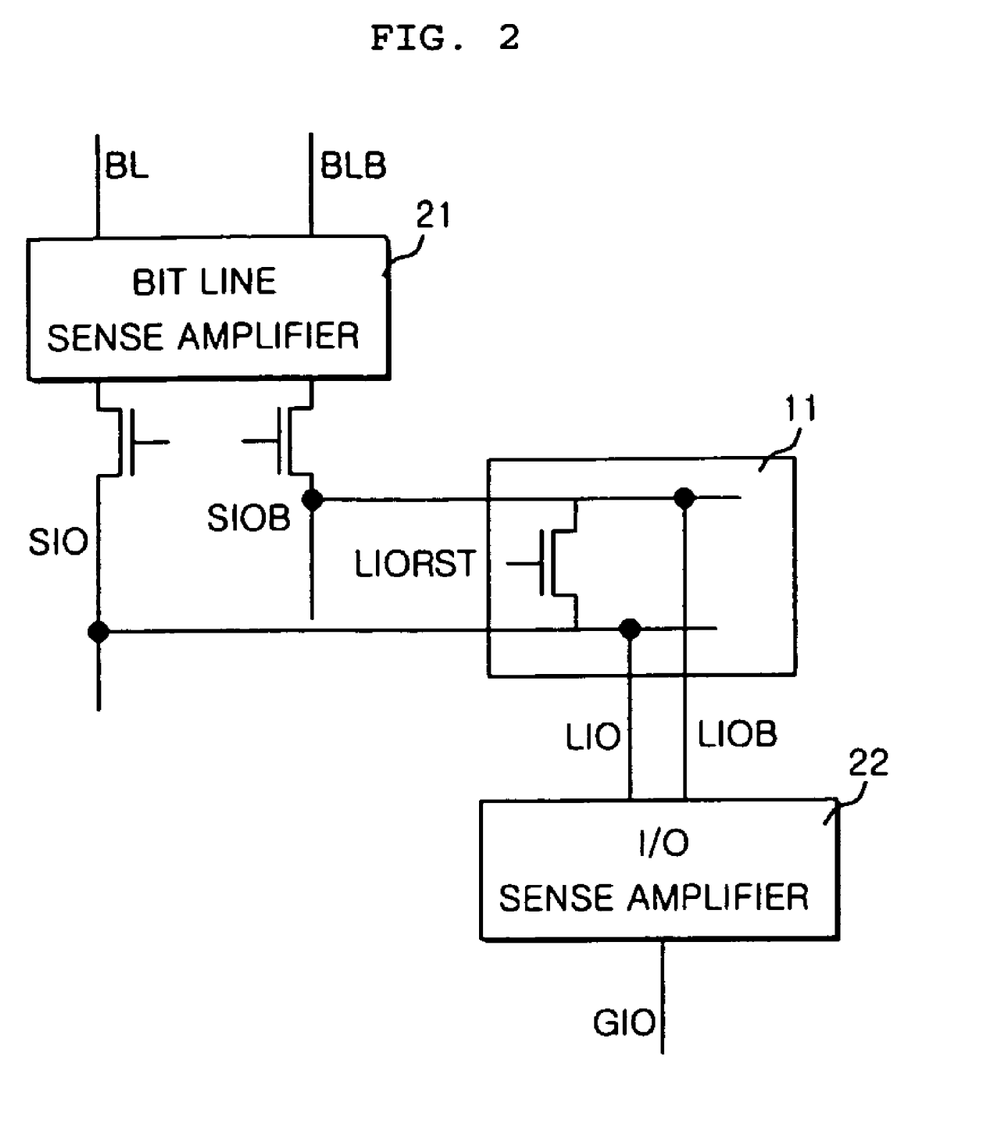
FIG. 2 is a circuit diagram showing the configuration of an I/O switch shown in FIG. 1.

FIG. 1 is a view showing the layout of an example of a core cell structure of a semiconductor memory apparatus according to the related art. FIG. 2 is a circuit diagram showing the configuration of an I/O switch shown in FIG. 1.

A semiconductor memory apparatus according to the related art includes a predetermined number of unit cell blocks that are arranged at predetermined intervals in column and row directions as shown in FIG. 1.

First input and output lines SIO and SIOB for reading out or writing data from or into corresponding cells are formed at predetermined intervals along the row direction. At least a pair of first input lines SIO and first output lines SIOB are provided. The phase of "SIOB" is opposite to the phase of "SIO".

Second input and output lines LIO and LIOB for reading out data from the first input and output lines or writing data into the cells through the first input and output lines are formed at predetermined intervals along the column direction. At least a pair of second input lines LIO and second output lines LIOB are provided. The phase of "LIOB" is opposite to the phase of "LIO".

An I/O switch 11 is formed at each of the nodes where the first input and output lines intersect the second input and output lines.

The detailed connection state and configuration of the I/O switch 11 is as follows. As shown in FIG. 2, a bit line sense amplifier 21 is connected to a bit line BL connected to each cell and a bit line bar BLB having an inverted phase with respect to the bit line. An output terminal of the bit line sense amplifier 21 is connected to the first input and output lines SIO and SIOB. The bit line sense amplifier 21 serves to sense and amplify data on the bit line.

The first input and output lines SIO and SIOB are connected to the second input and output lines LIO and LIOB, respectively. The I/O switch 11 is formed at the node where the first input and output lines SIO and SIOB intersect the second input and output lines LIO and LIOB. The I/O switch 11 has a transistor having a source and a drain connected to "LIO" and "LIOB", respectively, and a gate through which a second I/O line reset signal LIORST (hereinafter, referred to as a reset signal) is input.

The reset signal is output from a reset driver 12 (FIG. 1).

An IO sense amplifier 22 is connected to the second input and output lines LIO and LIOB, and the output terminal of the IO sense amplifier 22 is connected to a third I/O line GIO. The IO sense amplifier 22 serves to sense and amplify data on the second input and output lines LIO and LIOB.

In the semiconductor memory apparatus according to the related art having the above-mentioned configuration, before a column selection signal for reading out or writing data in placed in an active state, the reset signal LIORST input to the I/O switch 11 by the reset driver 12 is enabled.

Accordingly, each I/O switch 11 conducts a pre-charge operation by short-circuiting the second input and output lines LIO and LIOB according to the reset signal LIORST, which makes it possible to prepare for reading out or writing data.

The reset signal LIORST is disabled while data is read out or written. Accordingly, the I/O switch 11 performs an operation of transmitting data on the second input and output lines LIO and LIOB to the I/O sense amplifier.

The core cell structure of the semiconductor memory apparatus shown in FIG. 1 is configured as a combo type in order to use either all the cells, to use unit cells belonging to any one of the upper and lower half regions where the whole cell region is divided on the basis of the row direction, or to use left and right regions where the upper and lower half regions obtained by dividing the whole cell region on the basis of the row direction are divided on the basis of the column direction.

Specifically, the semiconductor memory apparatus is configured such that a user can use a desired unit cell region by setting an operation mode.

In the case of using unit cells by dividing the whole cell region, for example, in the case of setting an operation mode where the upper half region is used, the unit cells in the lower half region are not used.

However, in the semiconductor memory apparatus according to the related art, reset signals are supplied to all of the I/O switches at predetermined times without distinguishing between the upper and lower regions. Thus, even the I/O switches corresponding to unit cells not concerned with the actual memory operation perform a switching operation according to the reset signals, which causes current consumption and unnecessary power consumption.

SUMMARY

Embodiments of the present invention provide a semiconductor memory apparatus and a method of resetting I/O lines of a semiconductor memory apparatus capable of minimizing power consumption.

According to an embodiment of the present invention, a semiconductor memory apparatus includes a plurality of unit cell blocks that are formed in row and column directions, at least a pair of first input and output lines are formed at predetermined intervals in the row direction, at least a pair of second input and output lines are formed at predetermined intervals in the column direction, I/O switches that are connected to a first node group and a second node group, and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks, and a reset selection unit that selectively outputs a reset signal to each line of the I/O switches.

According to another embodiment of the present invention, a method is provided of resetting input/output lines of a semiconductor memory apparatus including a plurality of unit cell blocks that are formed at predetermined intervals in row and column directions, first input and output lines that are formed at predetermined intervals in the row direction at least in a pair, second input and output lines that are formed at predetermined intervals in the column direction at least in a pair, I/O switches that are connected to a first node group and a second node group and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks, and a reset selection unit that selectively outputs a reset signal to each line of I/O switches. The method includes determining the number of divided unit cell regions according to a mode signal input from the outside of the semiconductor memory apparatus, determining the position of a divided unit cell region according to a column address and a row address, and performing a reset operation on only the I/O switches corresponding to the determined positions.

DESCRIPTION OF EXEMPLARY EMBODIMENT

Hereinafter, an exemplary embodiment of the present invention will be described with reference to the accompanying drawings.

Figure 3:
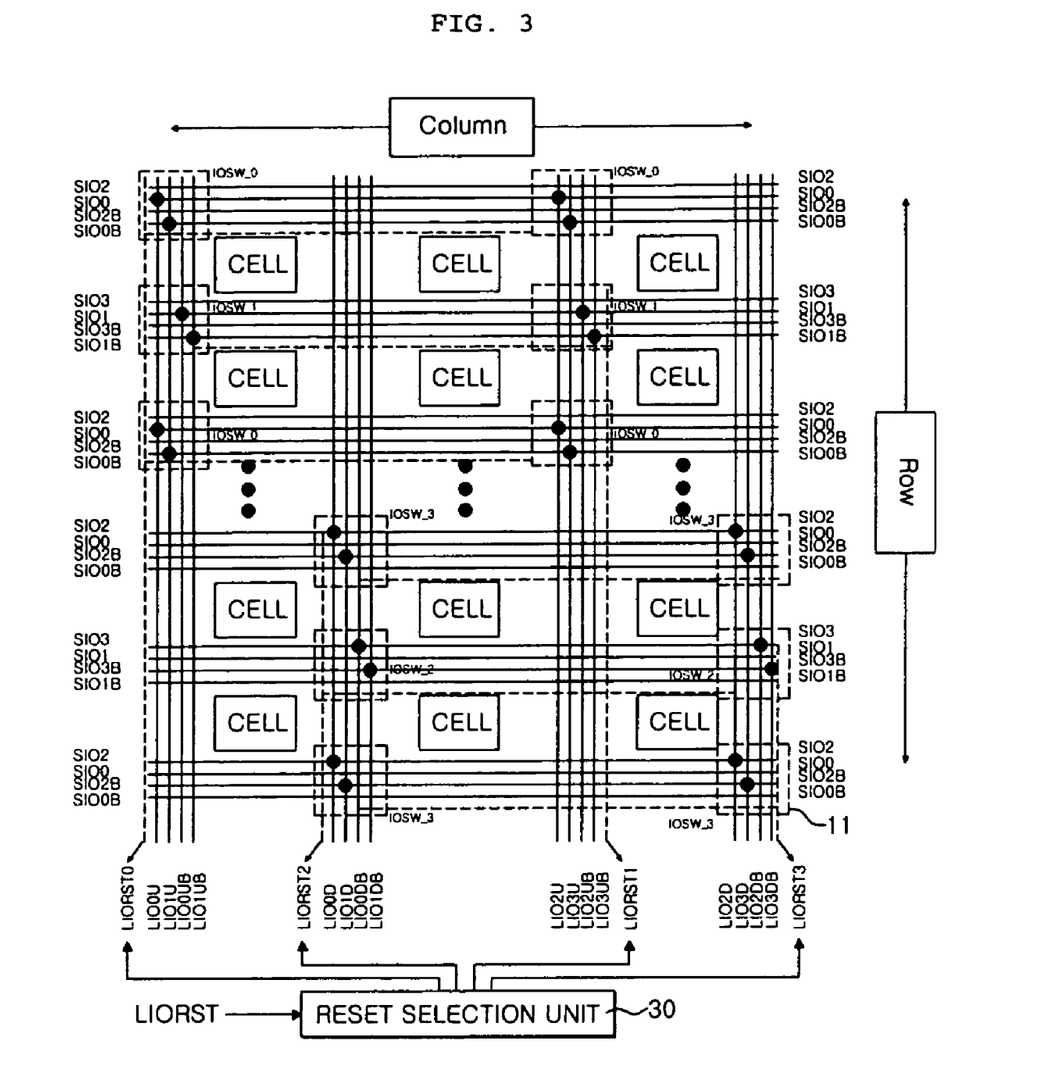
FIG. 3 is a view showing the layout of a semiconductor memory apparatus according to an exemplary embodiment of the invention.
Figure 4:
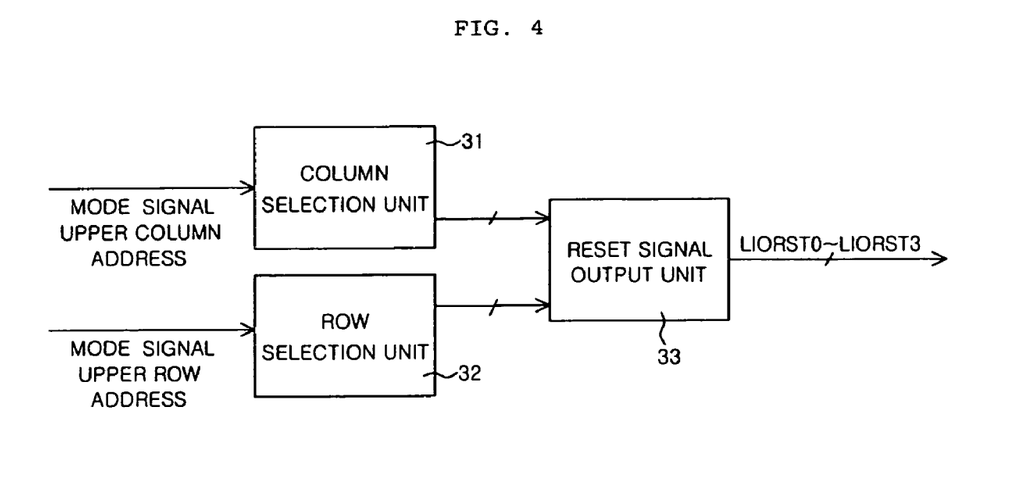
FIG. 4 is a block diagram showing the configuration of a reset selection unit shown in FIG. 3.
Figure 5A:
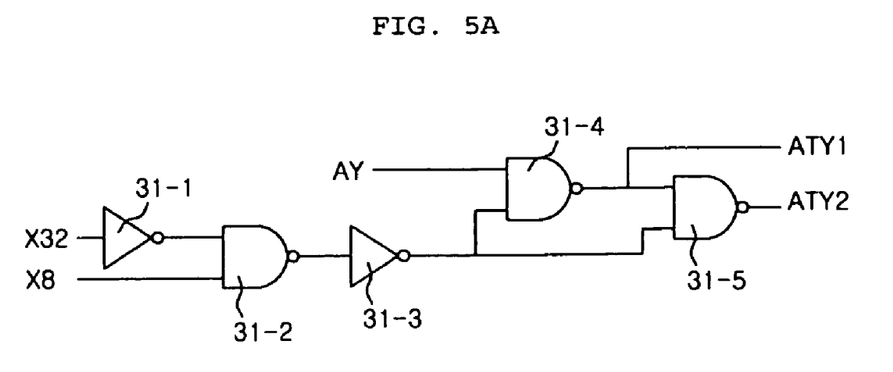
FIG. 5A is a circuit diagram showing a column selection unit shown in FIG. 4.
Figure 5B:
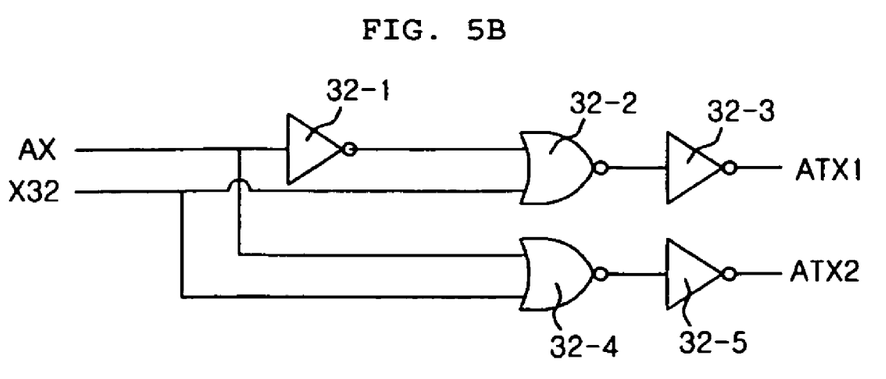
FIG. 5B is a circuit diagram showing a row selection unit shown in FIG. 4.
Figure 5C:
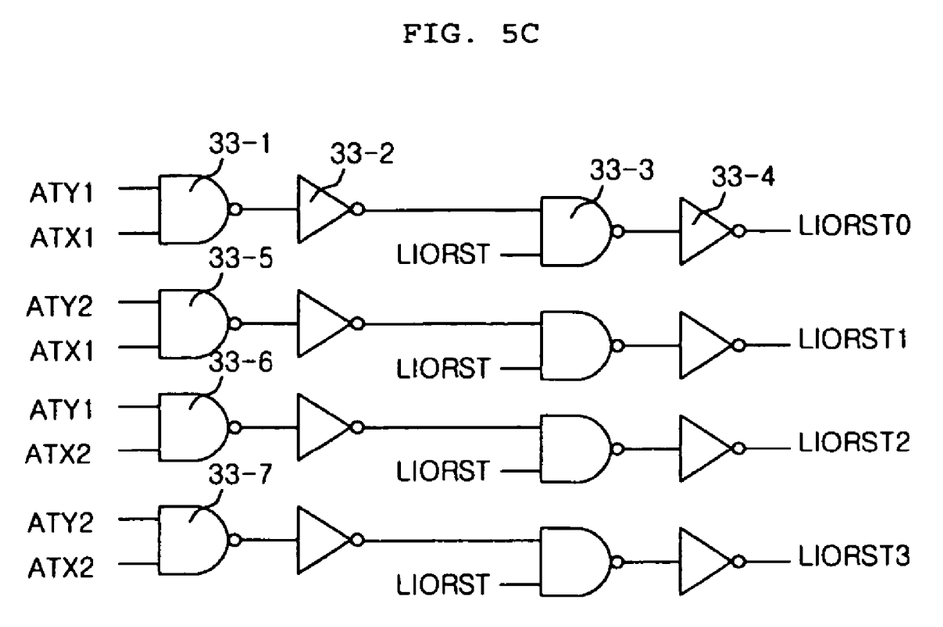
FIG. 5C is a circuit diagram showing a reset-signal output unit shown in FIG. 4.

FIG. 3 is a view showing the layout of a semiconductor memory apparatus according to an exemplary embodiment of the present invention. FIG. 4 is a block diagram showing the configuration of a reset selection unit shown in FIG. 3. FIG. 5A is a circuit diagram showing the configuration of a column selection unit shown in FIG. 4. FIG. 5B is a circuit diagram showing the configuration of a row selection unit shown in FIG. 4. FIG. 5C is a circuit diagram showing the configuration of a reset signal output unit shown in FIG. 4.

A semiconductor memory apparatus according to an exemplary embodiment of the present invention includes a plurality of unit cell blocks that are formed at predetermined intervals in row and column directions, at least a pair of first input and output lines SIO and SIOB that are formed at predetermined intervals in the row direction, at least a pair of second input and output lines LIO and LIOB that are formed at predetermined intervals in the column direction, I/O switches 11 that are connected to a first node group and a second node group and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks, and a reset selection unit 30 that selectively outputs a reset signal to each line of I/O switches 11.

Here, when the first node group corresponds to upper nodes on the basis of the row direction, the second node group corresponds to lower nodes on the basis of the row direction. In contrast, when the first node group corresponds to lower nodes on the basis of the row direction, the second node group corresponds to upper nodes on the basis of the row direction.

The number of first input and output lines SIO and SIOB and the number of second input and output lines LIO and LIOB may vary depending on memory capacity or a design method. FIG. 3 shows the layout of the semiconductor memory apparatus according to an exemplary embodiment of the present invention when core cells are arranged in a matrix shape of 1K (1024) columns by 8K rows.

The I/O switch 11 may be the same as the I/O switch according to the related art with respect to its internal configuration and the basic connection manner in which the I/O switch is connected to the first input and output lines and the second input and output lines, except for the position in which the I/O switch 11 is formed.

The reset selection unit 30 includes, as shown in FIG. 4, a column selection unit 31 that outputs a column selection signal for selecting a column to be used according to a mode signal and a column address, a row selection unit 32 that outputs a row selection signal for selecting a row to be used according to the mode signal and a row address, and a reset signal output unit 33 that outputs a reset signal corresponding to the outputs of the column selection unit 31 and the row selection unit 32.

Turning now to FIG. 5A, the column selection unit 31 includes a first inverter 31-1 that inverts a first mode signal X32, a first NAND gate 31-2 that receives the output of the first inverter 31-1 and a second mode signal X8, a second inverter 31-3 that inverts the output of the first NAND gate 31-2, a second NAND gate 31-4 that receives the output of the second inverter 31-3 and an upper column address AY, that is, an upper address of column addresses, and outputs a first column selection signal ATY1, and a third NAND gate 31-5 that receives the output of the second NAND gate 31-4 and the output of the second inverter 31-3 and outputs a second column selection signal ATY2.

The first and second mode signals X32 and X8 are supplied from the outside of the semiconductor memory apparatus in order to set the operation mode of the semiconductor memory apparatus. When only the first mode signal X32 is in a "high level", an X32 mode using all the unit cells (0-th to 31-th blocks) is set. When only the second mode signal X8 is in a "high level", an X8 mode using a quarter of all the unit cells is set. When both the first and second mode signals X32 and X8 are in a "low level", an X16 mode using half of all the unit cells is set. The upper column address is used to designate all the columns or one of either the left or right half regions of the whole unit cell region. For example, when the upper column address is "0", the left half region may be designated, and when the upper column address is "1", the right half region may be designated, or vice versa. The first column selection signal ATY1 is a signal for selecting the columns in the left unit cell region and the second column selection signal ATY2 is a signal for selecting the columns in the right unit cell region. In the X8 mode, only one of the first and second column selection signals is in the "high level". Thus the columns in the left or right unit cell region are selected. In the X16 or X32 mode, since all the columns in both the left and right unit cell regions are used, both the first and second column selection signals are in the "high level".

As shown in FIG. 5B the row selection unit 32 includes a first inverter 32-1 that inverts an upper row address AX, that is, an upper address of row addresses, except for a bank address, a first NOR gate 32-2 that receives the output of the first inverter 32-1 and the first mode signal X32, a second inverter 32-3 that inverts the output of the first NOR gate 32-2 and outputs a first row selection signal ATX1, a second NOR gate 32-4 that receives the upper row address AX and the first mode signal X32, and a third inverter 32-5 that inverts the output of the second NOR gate 32-4 and outputs a second row selection signal ATX2.

The upper row address AX is used to designate all the rows or one of either the upper or lower unit cell regions corresponding to half of all the rows. For example, when the upper row address is "0", the rows in the upper unit cell region may be designated, and when the upper row address is "1", the rows in the lower unit cell region may be designated, or vice versa. The first row selection signal ATX1 is a signal for selecting the rows in the upper unit cell region, and the second row selection signal ATX2 is a signal for selecting the rows in the lower unit cell region. In all the modes except for the X32 mode, only one of the first and second row selection signals is in the "high level". Thus the rows in the upper or lower unit cell region are selected. In the X32 mode, since all the rows in both the upper and lower unit cell regions are used, both the first and second row selection signals are in the "high level".

The reset signal output unit 33 includes the same number of logic circuits as divided unit cell regions in order to select the divided unit cell regions and to output original reset signals LIORST to the divided unit cell regions, respectively. In this embodiment, since the unit cells are divided into the upper and lower regions in the row direction and into the left and right sides in the column direction, four logic circuits are configured in order to select the upper left, upper right, lower left, and lower right unit cell regions, respectively. The logic circuits are the same configuration, except for the inputs.

As shown in FIG. 5C, the reset signal output unit 33 includes a first NAND gate 33-1, a first inverter 33-2 that inverts the output of the first NAND gate 33-1, a second NAND gate 33-3 that receives the output of the first inverter 33-2 and an original reset signal LIORST externally supplied, and a second inverter 33-4 that inverts the output of the second NAND gate 33-3 and outputs the result. The first row selection signal ATX1 for selecting the upper unit cell region and the first column selection signal ATY1 for selecting the left unit cell region are input to the first NAND gate 33-1 for selecting the upper left unit cell region among the logic circuits. The first row selection signal ATX1 for selecting the upper unit cell region and the second column selection signal ATY2 for selecting the right unit cell region are input to the first NAND gate 33-5 of a logic circuit for selecting the upper right unit cell region. The second row selection signal ATX2 for selecting the lower unit cell region and the first column selection signal ATY1 for selecting the left unit cell region are input to the first NAND gate 33-6 of a logic circuit for selecting the lower left unit cell region. The second row selection signal ATX2 for selecting the lower unit cell region and the second column selection signal ATY2 for selecting the right unit cell region are input to the first NAND gate 33-7 of a logic circuit for selecting the lower right unit cell region.

The operation of the semiconductor memory apparatus according to the disclosed embodiment of the invention having the above-mentioned configuration is as follows.

For example, when the operation mode of the semiconductor memory apparatus is set to use the whole unit cell region (X32 mode) or to use half of the unit cell region (X16 mode), the column selection unit 31 of the reset selection unit 30 outputs the first column selection signal ATY1 and the second column selection signal ATY2 having the "high level".

Specifically, in all the modes except for the X8 mode, since all the columns in the left and right unit cell regions are used, the first column selection signal ATY1 and the second column selection signal ATY2 having the "high level" are output.

When the operation mode of the semiconductor memory apparatus is set to use a quarter of the unit cell region (X8 mode), the column selection unit 31 of the reset selection unit 30 outputs the first and second column selection signals ATY1 and ATY2, only one of which has the "high level" according to the upper column address AY.

Specifically, in the case of the X8 mode, since the columns in any one of the left and right unit cell regions are used, the first and second column selection signals ATY1 and ATY2, only one of which has the "high level" according to the upper column address AY, are output.

At this time, the upper column address AY may be determined according to the position of a unit cell region determined to be used in the X8 mode at the time of designing the semiconductor memory apparatus.

The operation of the above-mentioned column selection unit 31 is expressed by the following truth table. The truth table is created on the assumption that the first column selection signal ATY1 is a signal for selecting the columns in the left unit cell region, the second column selection signal ATY2 is a signal for selecting the column in the right unit cell region, the upper column address AY of "0" designates the columns in the left unit cell region, and the upper column address AY of "1" designates the columns in the right unit cell region.

| INPUT | | | OUTPUT | |
|---|---|---|---|---|
| X32 | X8 | AY | ATY1 | ATY2 |
| 0 | 1 | 0 | 1 | 0 |
| 1 | 0 | 0 | 1 | 1 |
| 0 | 0 | 0 | 1 | 1 |
| 0 | 1 | 1 | 0 | 1 |
| 1 | 0 | 1 | 1 | 1 |
| 0 | 0 | 1 | 1 | 1 |

Meanwhile, when the operation mode of the semiconductor memory apparatus is set to use the whole unit cell region (X32 mode), the row selection unit 32 of the reset selection unit 30 outputs the first row selection signal ATX1 and the second row selection signal ATX2 having the "high level".

Specifically, in the X32 mode, since all the rows in the upper and lower unit cell regions are used, the first and second row selection signals ATX1 and ATX2 having the "high level" are output.

When the operation mode of the semiconductor memory apparatus is set to use half or quarter of the unit cell region (X16 or X8 mode), the first and second row selection signals ATX1 and ATX2, only one of which has the "high level" according to the upper row address AX, are output.

Specifically, in the X16 or X8 mode, since the rows in any one of the upper and lower unit cell regions are used, the first and second row selection signals ATX1 and ATX2, only one of which has the "high level" according to the upper row address AX, are output.

The upper row address AX may be determined according to the position of a unit cell region determined to be used in the X16 or X8 mode at the time of memory design.

The operation of the above-mentioned row selection unit 32 is expressed by the following truth table. The truth table is created on the assumption that the first row selection signal ATX1 is a signal for selecting the rows in the upper unit cell region, the second row selection signal ATX2 is a signal for selecting the row in the lower unit cell region, the upper row address AX of "0" designates the rows in the upper unit cell region, and the upper row address AX of "1" designates the rows in the lower unit cell region.

| INPUT | | OUTPUT | |
|---|---|---|---|
| X32 | AX | ATX1 | ATX2 |
| 0 | 0 | 1 | 0 |
| 0 | 1 | 0 | 1 |
| 1 | 0 | 1 | 1 |
| 1 | 1 | 1 | 1 |

In each logic circuit of the reset signal output unit 33, only when both inputs of the corresponding logic circuit are in the "high level", the first NAND gate 33-1 outputs an output having the "low level". The first inverter 33-2 inverts the output of the first NAND gate 33-1 and outputs an output having the "high level" to the second NAND gate 33-3. Subsequently, the second NAND gate 33-3 outputs an output having the "low level" to the second inverter 33-4 while the original reset signal LIORST is in an active state (maintains the "high level"). The second inverter 33-4 inverts the output of the second NAND gate 33-3, thereby obtaining an output having the "high level". Specifically, only when both inputs of the first NAND gate 33-1 have the "high level", the original reset signal LIORST is supplied to the I/O switch 11 of the corresponding second input and output lines LIO and LIOB.

Meanwhile, when at least one of the inputs of the first NAND gate 33-1 of each logic circuit has the "low level", the final output of the corresponding logic circuit, that is, the output of the second inverter 33-4 has the "low level".

Specifically, the original reset signal LIORST is input to only the I/O switches 11 in the unit cell region selected by the column and row selection units 31 and 32 so as to operate the corresponding I/O switches 11. Meanwhile, the inputs of the I/O switches 11 in the other unselected unit cell regions maintain the "low level" so as to prevent the corresponding I/O switches from performing a switching operation.

It will be apparent to those skilled in the art that various modifications and changes may be made without departing from the scope and spirit of the present invention. Therefore, it should be understood that the above embodiments are not limiting but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The semiconductor memory apparatus and the method of resetting I/O lines of a semiconductor memory apparatus according to embodiments of the invention have the following effects.

First, it is possible to selectively control only the I/O switches in a selected unit cell region.

Second, since the switching operation of the unselected I/O switches among all the I/O switches is prevented, it is possible to prevent unnecessary current consumption and to remarkably reduce power consumption.

What is claimed is:

1. A semiconductor memory apparatus comprising:
    a plurality of unit cell blocks formed in row and column directions;
    at least a pair of first input and output lines formed at predetermined intervals in the row direction;
    at least a pair of second input and output lines that are formed at predetermined intervals in the column direction;
    I/O switches connected to a first node group and a second node group and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks; and
    a reset selection unit that selectively outputs a reset signal to each line of the I/O switches.

2. The semiconductor memory apparatus of claim 1, wherein the pair of first input and output lines has a first line and a second line through which data having a phase opposite to that of data transmitted through the first line is transmitted.

3. The semiconductor memory apparatus of claim 1, wherein the pair of second input and output lines includes a first line transmitting data and a second line transmitting data having a phase opposite to that of data transmitted through the first line.

4. The semiconductor memory apparatus of claim 1, wherein the I/O switch is connected between the pair of first input and output lines or between the pair of second input and output lines.

5. The semiconductor memory apparatus of claim 1, wherein the I/O switch is a transistor having a gate to which a reset signal is input.

6. The semiconductor memory apparatus of claim 1, wherein the reset selection unit includes:
    a column selection unit configured to output a column selection signal for selecting columns to be used based on a mode signal and a column address,
    a row selection unit configured to output a row selection signal for selecting rows to be used based on the mode signal and a row address, and
    a reset signal output unit configured to output a reset signal corresponding to the outputs of the column and row selection units.

7. The semiconductor memory apparatus of claim 6, wherein the column selection unit includes:
    a first inverter having an output and configured to invert a first mode signal, a first NAND gate having an output and configured to receive the output of the first inverter and a second mode signal, a second inverter having an output and configured to invert the output of the first NAND gate, a second NAND gate having an output and configured to receive the output of the second inverter and an upper column address and to output a first column selection signal, and a third NAND gate configured to receive the output of the second NAND gate and the output of the second inverter and to output a second column selection signal.

8. The semiconductor memory apparatus of claim 6, wherein the row selection unit includes:

a first inverter having an output and configured to invert an upper row address, a first NOR gate having an output and configured to receive the output of the first inverter and a first mode signal, a second inverter configured to invert the output of the first NOR gate and to output a first row selection signal, a second NOR gate having an output and configure to receive the upper row address and the first mode signal, and a third inverter configured to invert the output of the second NOR gate and to output a second row selection signal.

9. The semiconductor memory apparatus of claim 6, wherein the reset signal output unit has the same number of logic circuits as divided unit cell regions, and each logic circuit receiving a predetermined combination of a column selection signal and a row selection signal as input.

10. The semiconductor memory apparatus of claim 9, wherein the logic circuit includes:

a first NAND gate having an output and configure to receive the predetermined combination of the column selection signal and the row selection signal, a first inverter having an output and configured to invert the output of the first NAND gate, a second NAND gate having an output and configure to receive the output of the first inverter and an external original reset signal, and a second inverter configured to invert the output of the second NAND gate and output a result.

11. A method of resetting input/output lines of a semiconductor memory apparatus including a plurality of unit cell blocks that are formed in row and column directions, at least a pair of first input and output lines formed at predetermined intervals in the row direction, at least a pair of second input and output lines formed at predetermined intervals in the column direction, I/O switches connected to a first node group and a second node group and control data input and output of the first input and output lines and the second input and output lines, the first node group corresponding to half of the nodes in the row direction where the first input and output lines intersect the second input and output lines formed at the odd-numbered intervals of the intervals between columns of unit cell blocks, and the second node group corresponding to half of the nodes in the row direction where the first input and output lines intersect the second input and output lines formed at the even-numbered intervals of the intervals between columns of unit cell blocks, and a reset selection unit that selectively outputs a reset signal to each line of the I/O switches, the method comprising:

determining a number of divided unit cell regions according to a mode signal input from outside of the semiconductor memory apparatus;

determining a position of a divided unit cell region according to a column address and a row address; and performing a reset operation on only the I/O switches corresponding to the determined position.

12. The method of claim 11, wherein the determining of the number of divided unit cell regions according to the mode signal includes determining the number of divided unit cell regions based on combinations of a first mode signal and a second mode signal.

13. The method of claim 11, wherein the determining of the position of the divided unit cell region according to the column address and the row address includes determining whether the divided unit cell region is on a left side or a right side in a column direction according to an upper column address and determining whether the divided unit cell region is on an upper region or a lower region in a row direction according to an upper row address.

14. The method of claim 11, wherein the I/O switches that do not correspond to the determined position are maintained at a high or low level.

* * * * *